United States Patent
Lin et al.

(10) Patent No.: US 9,288,294 B2
(45) Date of Patent: Mar. 15, 2016

(54) HANDHELD ELECTRONIC DEVICE AND METHOD FOR ASSEMBLING DISPLAY PANEL THEREOF

(71) Applicant: HTC Corporation, Taoyuan County (TW)

(72) Inventors: Ming-Tien Lin, Taoyuan County (TW); Chih-Jen Hu, Taoyuan County (TW)

(73) Assignee: HTC Corporation, Taoyuan (TW)

( * ) Notice: Subject to any disclaimer, the term of this patent is extended or adjusted under 35 U.S.C. 154(b) by 313 days.

(21) Appl. No.: 13/655,455

(22) Filed: Oct. 19, 2012

(65) Prior Publication Data

US 2014/0111910 A1    Apr. 24, 2014

(51) Int. Cl.
| | |
|---|---|
| G06F 1/16 | (2006.01) |
| H04M 1/02 | (2006.01) |
| H05K 7/00 | (2006.01) |
| H05K 13/00 | (2006.01) |

(52) U.S. Cl.
CPC ............ *H04M 1/0268* (2013.01); *G06F 1/1626* (2013.01); *G06F 1/1637* (2013.01); *G06F 1/1652* (2013.01); *H04M 1/0266* (2013.01); *H05K 7/00* (2013.01); *H05K 13/00* (2013.01); *Y10T 29/49* (2015.01); *Y10T 29/4998* (2015.01)

(58) Field of Classification Search
CPC .................. G06F 1/1652; G06F 2001/133331; G06F 1/133305; H04M 1/0266; H04M 1/0268; C03C 19/00; C03C 17/00; H01L 2251/53338
USPC ...................................... 455/575.8; 361/679.3
See application file for complete search history.

(56) References Cited

U.S. PATENT DOCUMENTS

| | | | | |
|---|---|---|---|---|
| 5,706,108 | A * | 1/1998 | Ando et al. ................. | 359/16 |
| 6,738,111 | B2 * | 5/2004 | Kawata .......................... | 349/58 |
| 7,106,580 | B2 * | 9/2006 | Kugimiya et al. ........ | 361/679.22 |
| 7,368,307 | B2 * | 5/2008 | Cok .............................. | 438/26 |
| 7,463,734 | B2 * | 12/2008 | Tolbert .............. | B32B 17/10018 379/433.04 |
| 7,586,739 | B2 * | 9/2009 | Weksler et al. .......... | 361/679.26 |
| 8,773,848 | B2 * | 7/2014 | Russell-Clarke et al. ........................ | 361/679.21 |
| 2002/0027636 | A1* | 3/2002 | Yamada ........................ | 349/155 |
| 2004/0135160 | A1* | 7/2004 | Cok ................................. | 257/88 |
| 2005/0117197 | A1* | 6/2005 | Ide ................................ | 359/291 |

(Continued)

FOREIGN PATENT DOCUMENTS

| | | |
|---|---|---|
| CN | 1651980 | 8/2005 |
| CN | 102445774 | 5/2012 |

(Continued)

OTHER PUBLICATIONS

"Office Action of Taiwan Counterpart Application", issued on Sep. 24, 2014, p. 1-p. 7, in which the listed references were cited.

*Primary Examiner* — Adrian S Wilson
(74) *Attorney, Agent, or Firm* — Jianq Chyun IP Office

(57) ABSTRACT

A handheld electronic device includes a body, a transparent cover, and a display panel. The body has a display opening. The transparent cover is disposed on the display opening. The transparent cover includes a first surface facing outside of the body and a second surface opposite to the first surface, and the second surface includes a curved surface. A curvature radius of the first surface is different from a curvature radius of the second surface. The display panel bends along the second surface and is attached to the second surface. Moreover, a method for assembling the display panel of the handheld electronic device is provided.

13 Claims, 6 Drawing Sheets

(56) References Cited

U.S. PATENT DOCUMENTS

| | | | |
|---|---|---|---|
| 2005/0156908 A1* | 7/2005 | Sato et al. | 345/173 |
| 2006/0202618 A1* | 9/2006 | Ishii et al. | 313/513 |
| 2006/0216909 A1* | 9/2006 | Yamazaki et al. | 438/457 |
| 2006/0273304 A1* | 12/2006 | Cok | 257/40 |
| 2007/0146569 A1* | 6/2007 | Nouchi et al. | 349/58 |
| 2008/0067931 A1* | 3/2008 | Ito et al. | 313/506 |
| 2009/0096965 A1* | 4/2009 | Nagata | G02F 1/133305 349/103 |
| 2009/0115933 A1* | 5/2009 | Mimura | 349/59 |
| 2009/0124062 A1* | 5/2009 | Yamazaki et al. | 438/457 |
| 2011/0019123 A1* | 1/2011 | Prest | C03C 19/00 349/58 |
| 2011/0019129 A1 | 1/2011 | Nishizawa et al. | |
| 2011/0072856 A1* | 3/2011 | Davidson | B24B 1/00 65/61 |
| 2012/0236526 A1* | 9/2012 | Weber | 361/807 |
| 2013/0002583 A1* | 1/2013 | Jin | G06F 1/1637 345/173 |
| 2013/0034685 A1* | 2/2013 | An | H01L 51/524 428/121 |
| 2013/0293425 A1* | 11/2013 | Zhu et al. | 343/702 |

FOREIGN PATENT DOCUMENTS

| | | |
|---|---|---|
| JP | 2002091329 | 3/2002 |
| TW | 201140398 | 11/2011 |
| TW | M432839 | 7/2012 |
| TW | 201238416 | 9/2012 |

* cited by examiner

HANDHELD ELECTRONIC DEVICE AND METHOD FOR ASSEMBLING DISPLAY PANEL THEREOF

BACKGROUND OF THE INVENTION

1. Field of the Invention

The application relates to a handheld electronic device and particularly relates to a handheld electronic device with an increased inner space for accommodating components.

2. Description of Related Art

Technology industry advances rapidly in recent years, and handheld electronic devices, such as smart phones or tablet computers, are now extensively used in our daily life. As these electronic products become more and more common and gradually develop to be more convenient, multi-functional, and beautiful, appearance design becomes an important factor that attracts the consumers when they select and buy these handheld electronic devices.

Take the smart phone as an example. The smart phone provides multiple functions and can be used as a mobile phone, a basic WORD processor, a wireless modem, etc., and provide wireless network access. The smart phone provides various services, which allow the user to access the Internet, receive/send E-mails, and uploading data to cloud servers. Users' demands for smart phones have grown in recent years, and in order to satisfy the demands of different users, more functions are added to smart phones. Since more functions are added, the number of the components in the smart phone increases. The added components occupy the inner space of the smart phone and affect the design of the shape and size of the smart phone (e.g. miniaturization).

SUMMARY OF THE INVENTION

The application provides a handheld electronic device having an increased inner space for accommodating components, so as to make the arrangement of positions of the components inside the handheld electronic device more flexible and reducing the influence that the components cause to the shape and size of the handheld electronic device.

The application provides an assembling method adapted for a display panel of the handheld electronic device.

The application provides a handheld electronic device, including a body, a transparent cover, and a display panel. The body has a display opening. The transparent cover is disposed on the display opening. The transparent cover includes a first surface facing outside of the body and a second surface opposite to the first surface, and the second surface includes a curved surface. A curvature radius of the first surface is different from a curvature radius of the second surface. The display panel bends along the second surface and is attached to the second surface.

The application provides an assembling method for a display panel of a handheld electronic device. The handheld electronic device includes a body having a display opening, and the assembling method includes forming a transparent cover that is to be disposed on the display opening, wherein the transparent cover includes a first surface facing outside of the body and a second surface opposite to the first surface, and the second surface includes a curved surface. The display panel is attached to the second surface, and the transparent cover as well as the display panel is assembled to the body.

Based on the above, in the handheld electronic device of the application, the second surface of the transparent cover that faces toward the body is designed as the curved surface, and accordingly the display panel disposed under the transparent cover is attached to the second surface. The design of the curved second surface increases the space in the body of the handheld electronic device for accommodating components and consequently the layout of the components inside the handheld electronic device becomes more flexible. Moreover, the influence that the components cause to the shape and size of the handheld electronic device is reduced, which is conducive to the miniaturization of the handheld electronic device.

To make the aforementioned and other features and advantages of the application more comprehensible, several embodiments accompanied with figures are described in detail below.

BRIEF DESCRIPTION OF THE DRAWINGS

The accompanying drawings are included to provide a further understanding of the application, and are incorporated in and constitute a part of this specification. The drawings illustrate exemplary embodiments of the application and, together with the description, serve to explain the principles of the application.

DESCRIPTION OF THE EMBODIMENTS

Figure 1:
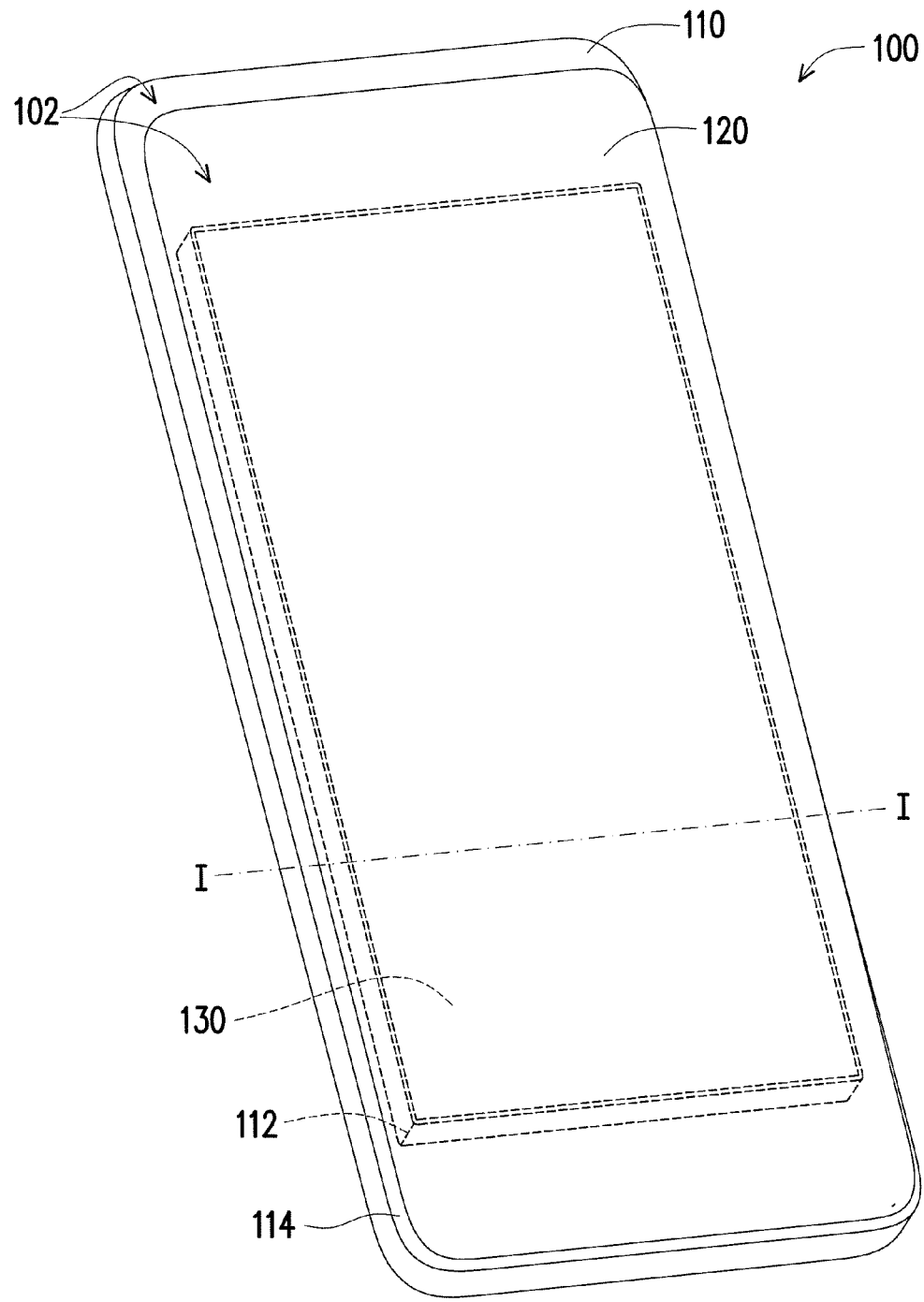
FIG. 1 is a schematic view of a handheld electronic device according to an embodiment of the invention.
Figure 2A:
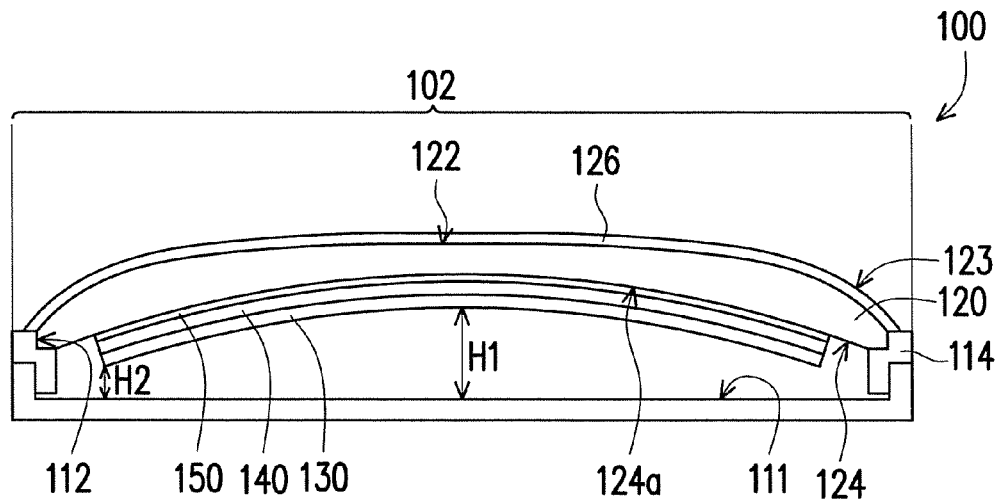
FIG. 2A is a schematic cross-sectional view of the handheld electronic device of FIG. 1 along the line I-I.

FIG. 1 is a schematic view of a handheld electronic device according to an embodiment of the invention. FIG. 2A is a schematic cross-sectional view of the handheld electronic device of FIG. 1 along the line I-I. Referring to FIG. 1 and FIG. 2A, a handheld electronic device 100 of this embodiment includes a body 110, a transparent cover 120, and a display panel 130. The body 110 has a display opening 112. The transparent cover 120 is disposed on the display opening 112. The transparent cover 120 includes a first surface 122 facing outside of the body 110 and a second surface 124 opposite to the first surface 122, and the second surface 124 is a curved surface. The display panel 130 bends along the second surface 124 and is attached to the second surface 124. In this embodiment, the handheld electronic device 100 is a smart phone, for example. The display panel 130 may be a non-flexible display panel or a flexible display panel. In the case that the display panel 130 is a non-flexible display panel, a surface of the display panel 130 has a radian that matches a radian of the curved surface of the second surface 124, such that the display panel 130 is completely attached to the second surface 124. The non-flexible display panel 130 may be a liquid crystal display panel, an organic electro-luminescent display panel, or other types of non-flexible display panels. However, in other embodiments, the display panel 130 may also be a flexible organic electro-luminescent display panel, an electronic paper, or other types of flexible display panels. The application is not restricted to the foregoing.

When the display panel 130 is bent along the second surface 124 of the transparent cover 120, a first distance H1 exists between a center of the display panel 130 and a bottom surface 111 inside the body 110, and a second distance H2 exists between an edge of the display panel 130 and the bottom surface 111 inside the body 110. In this embodiment, the first distance H1 is greater than the second distance H2. That is to say, if the second surface 124 does not have the curved surface, the display panel 130 would be attached to the second surface 124 in a flat state, and consequently, a height of an inner space of the body 110 would be equal to the second distance H2. When the second surface 124 has the curved surface, the height of the inner space of the body 110 under the display panel 130 is greater than the second distance H2. Therefore, the inner space inside the body 110 of the handheld electronic device 100 is increased for accommodating more electronic components, and the layout of the components inside the handheld electronic device 100 becomes more flexible. On the other hand, when the flexibility of the spatial layout inside the body 110 is increased, the influence that the components inside the handheld electronic device 100 may cause to the design of shape and size is reduced, which is conducive to the miniaturization of the handheld electronic device 100, for example.

Figure 2B:
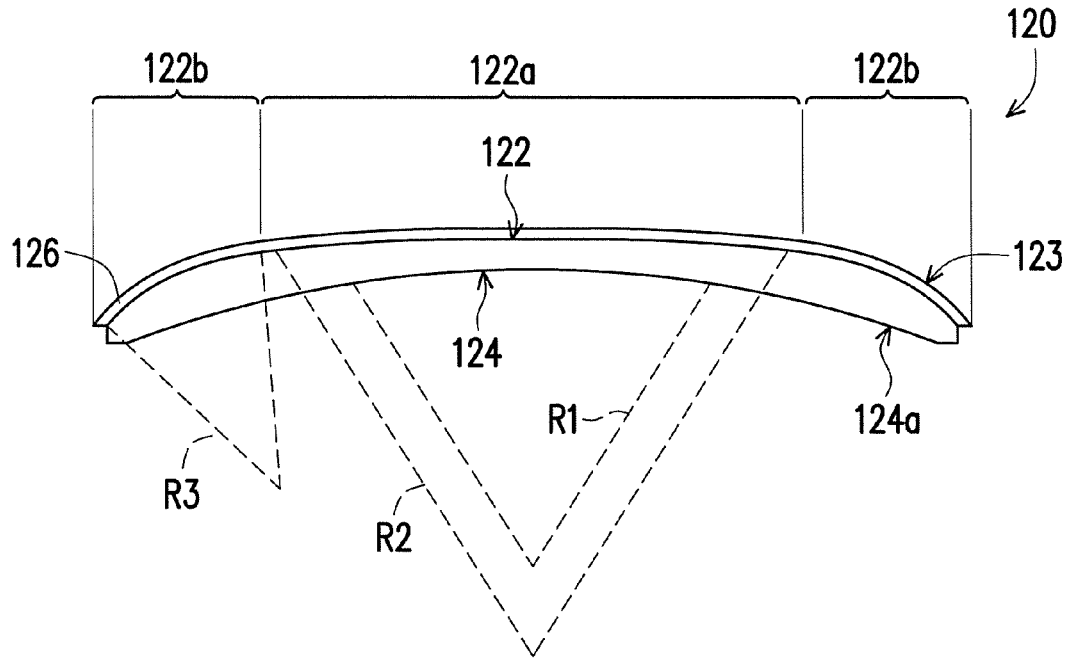
FIG. 2B is a schematic view of a transparent cover of FIG. 2A.

A structure of the transparent cover 120 is explained in detail below. FIG. 2B is a schematic view of the transparent cover of FIG. 2A. Referring to FIG. 2A and FIG. 2B, in the transparent cover 120, the second surface 124 is for example an arc curved surface 124a. In this embodiment, a curvature radius R1 of the arc curved surface 124a is in a range of 200-600 mm. The curvature radius R1 of the arc curved surface 124a is adjustable according to actual requirements, so as to prevent the display panel 130 from being overly bent and damaged when the curvature radius R1 is too little, or prevent limiting the bend of the display panel 130 and restricting the inner space of the handheld electronic device 100 when the curvature radius R1 is too large, for example.

A method for attaching the display panel 130 to the transparent cover 120 is for example to dispose an adhesive layer 150 on the display panel 130 and the transparent cover 120 as a medium for adhering the display panel 130 and the transparent cover 120. The adhesive layer 150 may be disposed on the display panel 130 first, and then the display panel 130 is adhered to the second surface 124 by the adhesive layer 150. However, the application is not restricted to the above. In other embodiments of the application, which are not disclosed here, the adhesive layer may be disposed on the second surface first, and then the display panel is adhered to the second surface. In addition, in order to prevent the adhesive layer 150 from affecting the display quality of the display panel 130, the adhesive layer 150 may be an optical adhesive that has high transmittance.

In order to satisfy the user's demands for multiple functions of the smart phone, such as a touch input function, in this embodiment, a touch panel 140 is selectively disposed between the display panel 130 and the transparent cover 120 of the handheld electronic device 100. The touch panel 140 provides the touch input function for the handheld electronic device 100. Moreover, according to other embodiments of the application, which are not disclosed here, the display panel may be an embedded touch display panel that is flexible or has a curved surface, so as to reduce the influence that the touch panel causes to the thickness. In the case that the display panel of the handheld electronic device is the embedded touch display panel that has the curved surface or has flexibility, the handheld electronic device does not require the additional touch panel to provide the touch input function. Moreover, the handheld electronic device may not include the touch panel and provide no touch control function. The application is not restricted to the foregoing.

In the transparent cover 120 of the handheld electronic device 100, the first surface 122 faces outside of the body 110 and includes a curved surface 123. More specifically, in terms of an external surface of the handheld electronic device 100, a surface of a screen viewed by the user is a first external surface 102 (a range indicated in FIG. 2A), for example. In FIG. 2A, the first external surface 102 includes the first surface 122 of the transparent cover 120 and a front frame 114 of the body 110. In this embodiment, the first surface 122 includes the curved surface 123, which allows the first external surface 102 of the handheld electronic device 100 to have different shapes. If the first surface 122 of the transparent cover 120 is designed into a shape that includes the curved surface 123, the first external surface 102 of the handheld electronic device 100 may be designed variously to increase the variety of the appearance design.

In this embodiment, a curvature radius of the first surface 122 is different from a curvature radius of the second surface 124. In other words, the first surface 122 and the second surface 124 may have curved surfaces that are independently designed. The curvature radius of the first surface 122 is designed according to the requirement of the appearance of the handheld electronic device 100 while the curvature radius of the second surface 124 is designed differently to meet the requirement of the inner space of the body 110. Therefore, the transparent cover 120 not only increases the flexibility of the inner space of the body 110 for accommodating components but also satisfies the requirement of the appearance of the handheld electronic device 100. However, according to the application, the curvature radii of the first surface and the second surface are not necessarily different. In other embodiments of the application that are not disclosed here, the first surface and the second surface may have the same curvature radius.

In FIG. 2B, the curved surface 123 includes a plurality of curved surfaces having different curvature radii, for example. In this embodiment, a curvature radius R2 of a central area 122a of the first surface 122 is greater than a curvature radius R3 of a peripheral area 122b of the first surface 122. That is to say, in the central area 122a of the first surface 122, the surface has less curvature variation and reduces the influence that the curved surface 123 causes to the image and font displayed by the display panel 130. In the peripheral area 122b of the first surface 122, the surface has greater curvature variation. Thus, the change of the appearance is more obvious and can satisfy the requirement of appearance design. However, it is noted that the application is not intended to limit the curvature variation of the curved surface 123.

In this embodiment, the first surface 122 of the transparent cover 120 is a portion of the first external surface 102, and in order to prevent the first surface 122 from being scratched or damaged by the surrounding, a reinforced layer 126 is selectively disposed outside the transparent cover 120 to cover the first surface 122 of the transparent cover 120. A material of the reinforced layer 126 includes glass or other materials that have similar functions. The reinforced layer 126 protects the transparent cover 120 of the handheld electronic device 100 from being scratched. A hardness of the reinforced layer 126 is for example over 4H according to the pencil hardness test. However, the hardness of the reinforced layer 126 may be varied according to different criteria. Thus, the application is not intended to limit the hardness.

Moreover, various methods may be adopted to fabricate or form the second surface 124 of the transparent cover 120 into the curved surface (e.g. the arc curved surface 124a). For instance, a material of the transparent cover 120 is plastic, and the transparent cover 120 is fabricated by plastic injection. The aforementioned plastic is transparent polycarbonate (PC), for example. The transparent polycarbonate has high transmittance and strength and is suitable for plastic mold injection and mass production. However, it is noted that the application is not intended to limit the material and fabrication process of the transparent cover 120.

Figure 3A:
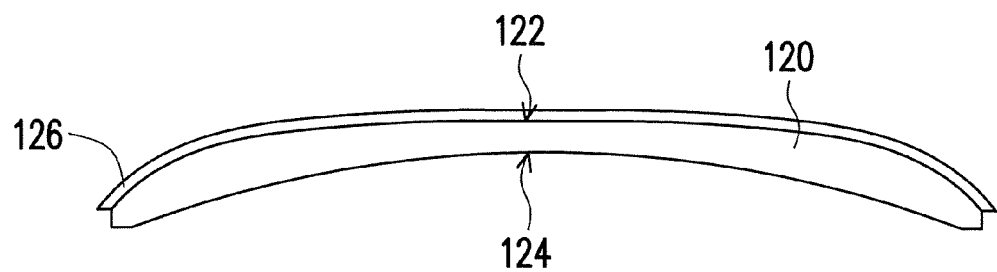
FIGS. 3A to 3D are schematic views illustrating a method for assembling a display panel of the handheld electronic device of FIG. 1.
Figure 3B:
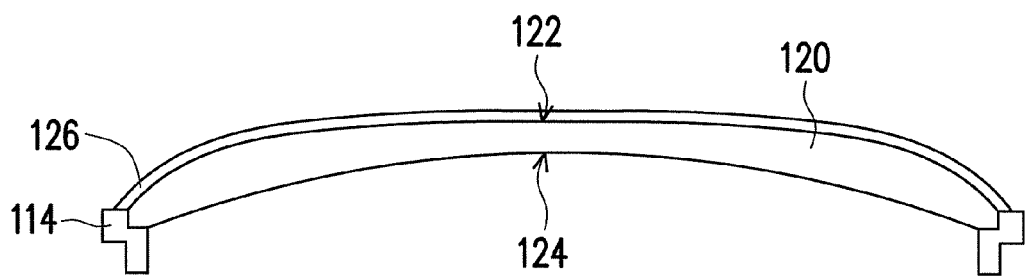
Figure 3C:
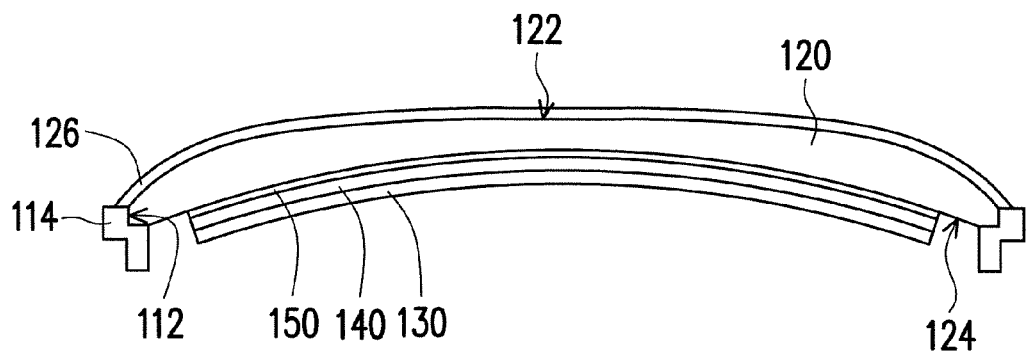
Figure 3D:
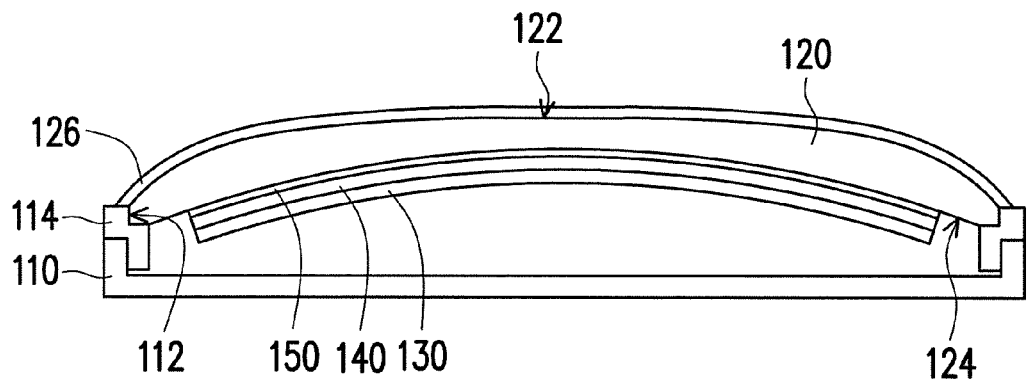

FIGS. 3A to 3D are schematic views illustrating a method for assembling a display panel of the handheld electronic device of FIG. 1. Please refer to FIGS. 3A to 3D. In this embodiment, the assembling method of the display panel 130 of the handheld electronic device 100 includes first forming the transparent cover 120 that is to be disposed in the display opening 112 (shown in FIG. 2A), as illustrated in FIG. 3A. The transparent cover 120 includes the first surface 122 facing outside of the body 110 (shown in FIG. 2A) and the second surface 124 opposite to the first surface 122, and the second surface 124 is a curved surface. In FIG. 3B, the transparent cover 120 is selectively disposed on the front frame 114. A method for fixing the transparent cover 120 to the front frame 114 is, for example, using a high-adhesive double sided adhesive to adhere and fix the transparent cover 120 and the front frame 114 to each other. In this embodiment, the display panel 130 may be a bent liquid crystal display panel, a bent organic electro-luminescent display panel, or other bent non-flexible display panels that are prepared in advance. That is, the bent display panel 130 is obtained for example by fabricating the display panel 130 on a bent substrate, such that the display panel 130 has a bent shape. However, the application does not limit the method for fabricating the bent display panel 130. In other embodiments of the application that are not disclosed here, the display panel may be fabricated on the substrate first and then bent. In FIG. 3C, the display panel 130 is attached to the second surface 124. In other embodiments, the display panel 130 may be a flexible organic electro-luminescent display panel, an electronic paper, or other types of flexible display panels. Therefore, the display panel 130 may be bent and directly attached to the second surface 124. Finally, in FIG. 3D, the transparent cover 120 as well as the display panel 130 are assembled to the body 110.

In this embodiment, the body 110 includes the front frame 114, for example. The transparent cover 120 is first assembled to the front frame 114 and then attached to the display panel 130, and finally the transparent cover 120 attached to the display panel 130 is assembled to the body 110. Nevertheless, the form of the body 110 is not limited to the above. In some circumstances, the assembling method may directly enter the step of FIG. 3C to attach the display panel 130 to the transparent cover 120 after the transparent cover 120 is formed in FIG. 3A. In FIG. 3C, the display panel 130 is attached to the second surface 124 via the adhesive layer 150, and the adhesive layer 150 may be an optical adhesive having high transmittance. In addition, the touch panel 140 may be attached to the second surface 124 or the display panel 130 first before the display panel 130 is attached to the second surface 124. The above disclosure of the application should not be construed to limit whether the touch panel 140 is first attached to the second surface 124 or the display panel 130 in the assembling process.

Figure 4A:
FIGS. 4A to 4C are schematic views illustrating a method for forming the transparent cover of FIG. 3A.
Figure 4B:
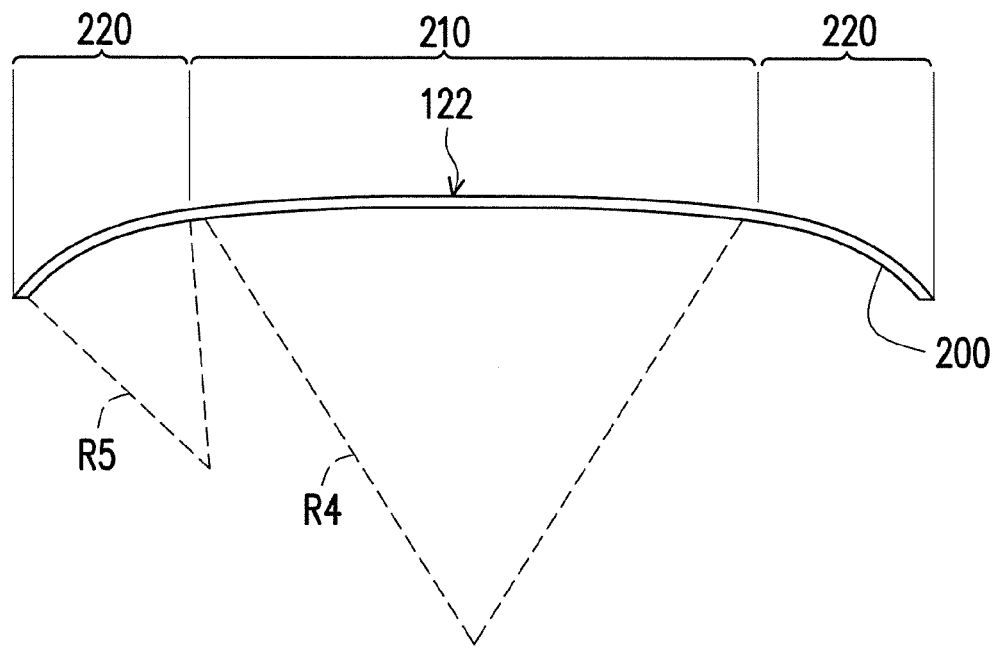
Figure 4C:
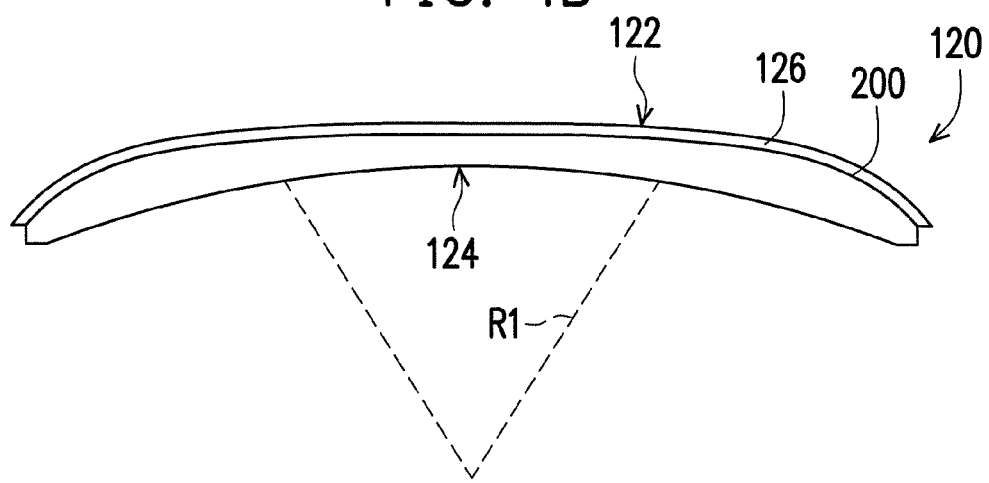

FIGS. 4A to 4C are schematic views illustrating a method for forming the transparent cover of FIG. 3A. However, it is noted that the method for forming the transparent cover 120 of the application is not limited to the disclosure of FIGS. 4A to 4C. In this embodiment, the method for forming the transparent cover 120, for example, includes providing a reinforced plate 200 as shown in FIG. 4A. Then, in FIG. 4C, a transparent layer is disposed on the reinforced plate 200 to form the transparent cover 120 shown in FIG. 3A. The reinforced plate 200 forms the reinforced layer 126 and covers the first surface 122 of the transparent cover 120. Moreover, after the step of FIG. 4C is completed, the second surface 124 of the transparent cover 120 is simultaneously foamed. The second surface 124 is the arc curved surface 124a and the curvature radius R1 of the arc curved surface 124a is in a range of 200-600 mm.

Additionally, in FIG. 4B, the method for forming the transparent cover 120 further includes processing the reinforced plate 200 into a bent plate. A curvature radius R4 of a central area 210 of the reinforced plate 200 is greater than a curvature radius R5 of a peripheral area 220 of the reinforced plate 200 for molding the first surface 122 of the transparent cover 120. In this embodiment, the step of FIG. 4A may be selectively omitted according to the design of the shape of the transparent cover 120 (for example, a planar surface). However, it is noted that the application is not limited to the above.

Figure 5A:
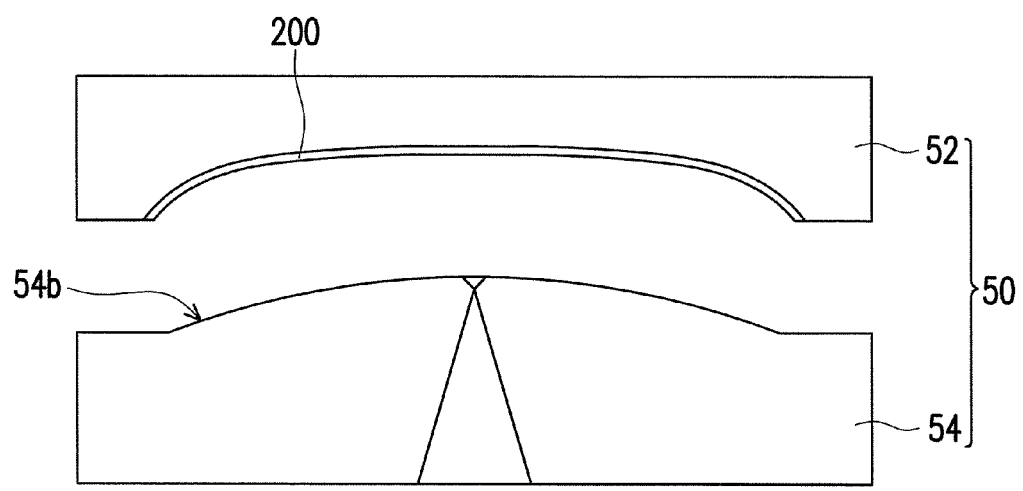
FIGS. 5A to 5C are schematic views illustrating a method for forming a reinforced plate of FIG. 4B into the transparent cover of FIG. 4C.
Figure 5B:
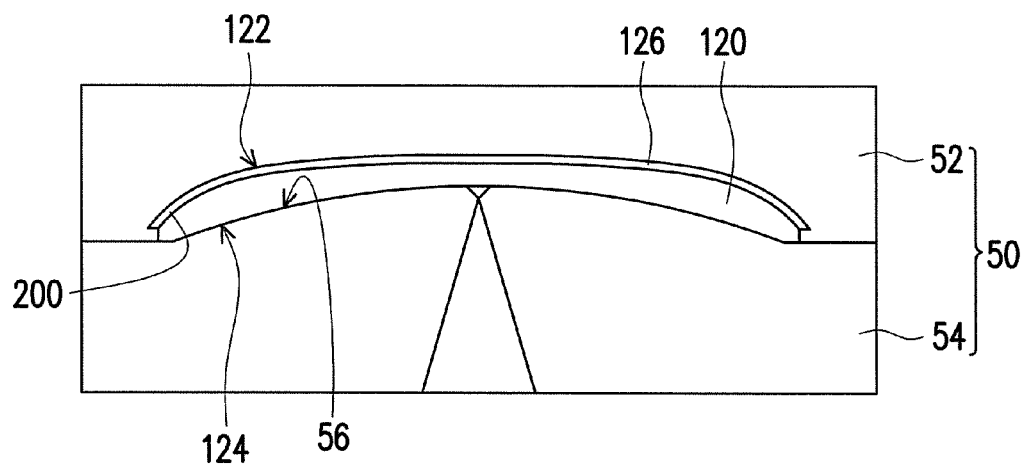
Figure 5C:
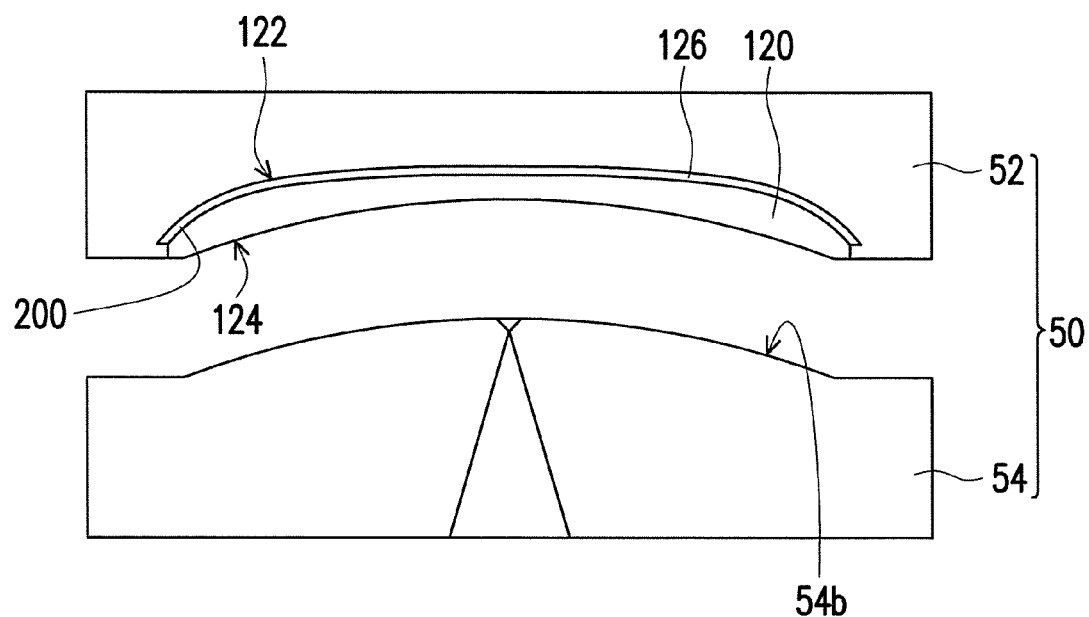

In FIG. 4C, the transparent layer is disposed on the reinforced plate 200 by plastic injection, for example. Another embodiment is given below to illustrate a method for forming the transparent cover 120. FIGS. 5A to 5C are schematic views illustrating a method for forming the reinforced plate of FIG. 4B into the transparent cover of FIG. 4C. In this embodiment, the reinforced plate 200 is disposed in a mold 50 to form the transparent cover 120 by insert injection molding, for instance. The mold 50 includes a core 52 and a cavity 54, for example. In FIG. 5A, the reinforced plate 200 is placed on a side of the mold 50 (leaning against the core 52 according to the figure). Then, in FIG. 5B, the core 52 is driven to move toward the cavity 54 and contact the cavity 54, such that the core 52 and the cavity 54 forms an empty cavity 56. Next, a plastic material (e.g. polycarbonate) is poured into the mold while melted to fill the empty cavity 56, so as to form the transparent cover 120. The reinforced plate 200 forms the reinforced layer 126 of the transparent cover 120. The second surface 124 of the transparent cover 120 may be formed in the process of FIG. 5B, and the shape of the second surface 124 is complementary to a surface 54b of the cavity 54.

The above disclosure of the application is not intended to limit that the transparent cover is formed by placing the reinforced plate in the mold and then performing injection. In other embodiments of the application that are not disclosed here, the reinforced layer and plastic of the transparent cover may be fanned in the same set of mold by double injection. After the transparent cover 120 is formed and cooled in the empty cavity 56, in FIG. 5C, the core 52 is driven away from the cavity 54 for the transparent cover 120 to be removed. Through insert injection molding, the transparent cover 120 has the feature that the first surface 122 and the second surface 124 are different curved surfaces.

To conclude the above, in the handheld electronic device of the application, the second surface of the transparent cover that faces toward the body is designed as the curved surface, and the display panel disposed under the transparent cover is attached to the second surface. When the display panel is attached to the second surface, the inner space inside the body of the handheld electronic device is increased for accommodating more electronic components, and the layout of the components inside the handheld electronic device becomes more flexible. Therefore, the handheld electronic device of the application reduces the influence that the components may cause to the shape and size of the handheld electronic device, which is conducive to the miniaturization of the handheld electronic device, for example. In addition, the reinforced layer is disposed on the transparent cover according to the requirement of hardness, so as to prevent the first surface from being scratched or damaged by the surrounding.

It will be apparent to those skilled in the art that various modifications and variations can be made to the disclosed embodiments without departing from the scope or spirit of the application. In view of the foregoing, it is intended that the application covers modifications and variations of this disclosure provided that they fall within the scope of the following claims and their equivalents.

What is claimed is:

1. A handheld electronic device, comprising:
   a body comprising a display opening;
   a transparent cover disposed on the display opening and comprising a first surface facing outside of the body and a second surface opposite to the first surface, and the second surface comprising a curved surface, wherein a curvature radius of the first surface is different from a curvature radius of the second surface;
   a reinforced layer in direct contact with a substantial surface area of the first surface of the transparent cover; and
   a display panel bent along the second surface and attached to the second surface,
   wherein a material of the reinforced layer comprises glass, and a material of the transparent cover comprises plastic.

2. The handheld electronic device according to claim 1, wherein the second surface is an arc curved surface, and a curvature radius of the arc curved surface is in a range of 200-600 mm.

3. The handheld electronic device according to claim 1, further comprising an adhesive layer disposed between the display panel and the transparent cover.

4. The handheld electronic device according to claim 3, wherein the adhesive layer comprises an optical adhesive.

5. The handheld electronic device according to claim 1, wherein the first surface comprises a curved surface, and a curvature radius of a central area of the first surface is greater than a curvature radius of a peripheral area of the first surface.

6. The handheld electronic device according to claim 1, further comprising a touch panel disposed between the display panel and the transparent cover.

7. The handheld electronic device according to claim 1, wherein the display panel comprises a non-flexible display panel and a flexible display panel.

8. An assembling method for assembling a display panel of a handheld electronic device, comprising a body having a display opening, the method comprising:
   forming a transparent cover to be disposed on the display opening, the transparent cover comprising a first surface facing outside of the body and a second surface opposite to the first surface, and the second surface comprising a curved surface, wherein a curvature radius of the first surface is different from a curvature radius of the second surface, the method for forming the transparent cover comprising:
   providing a reinforced plate; and
   disposing the reinforced plate in a mold and pouring a material into the mold to form the transparent cover by injection molding, wherein the reinforced plate covers the first surface of the transparent cover;
   attaching the display panel to the second surface; and
   assembling the transparent cover as well as the display panel to the body.

9. The assembling method according to claim 8, wherein the method for forming the transparent cover further comprises processing the reinforced plate into a bent plate, and a curvature radius of a central area of the reinforced plate is greater than a curvature radius of a peripheral area of the reinforced plate for molding the first surface of the transparent cover.

10. The assembling method according to claim 8, wherein the second surface is an arc curved surface, and a curvature radius of the arc curved surface is in a range of 200-600 mm.

11. The assembling method according to claim 8, wherein the display panel is attached to the second surface via an adhesive layer.

12. The assembling method according to claim 11, wherein the adhesive layer comprises an optical adhesive.

13. The assembling method according to claim 8, further comprising disposing a touch panel between the display panel and the transparent cover.

* * * * *